(12) United States Patent
Yu et al.

(10) Patent No.: US 6,465,323 B1
(45) Date of Patent: Oct. 15, 2002

(54) METHOD FOR FORMING SEMICONDUCTOR INTEGRATED CIRCUIT MICROELECTRONIC FABRICATION HAVING MULTIPLE GATE DIELECTRIC LAYERS WITH MULTIPLE THICKNESSES

(75) Inventors: Mo-Chiun Yu, Taipei; Shih-Chang Chen, Taoyuan; Chen-Hua Yu, Hsin-Chu, all of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/898,838

(22) Filed: Jul. 3, 2001

(51) Int. Cl.$^7$ ............................................... H01L 21/76
(52) U.S. Cl. ........................ 438/424; 438/262; 438/400; 438/405; 438/423; 438/433
(58) Field of Search ................................ 438/424, 400, 438/262, 423, 433, 405

(56) References Cited

U.S. PATENT DOCUMENTS

| | | | |
|---|---|---|---|
| 5,672,521 A | 9/1997 | Barsan et al. | 438/276 |
| 6,147,008 A | 11/2000 | Chwa et al. | 438/762 |
| 6,184,093 B1 | 2/2001 | Sung | 438/275 |
| 6,211,098 B1 * | 4/2001 | Twu et al. | 438/787 |
| 6,268,248 B1 * | 4/2001 | Mehrad | 438/262 |
| 6,255,207 B1 * | 7/2001 | Jang | 438/597 |

* cited by examiner

*Primary Examiner*—Michael S. Lebentritt
*Assistant Examiner*—Pho M. Luu
(74) *Attorney, Agent, or Firm*—Tung & Associates

(57) ABSTRACT

Within a method for forming a series of gate dielectric layers having a plurality of thicknesses upon a semiconductor substrate, there is sequentially selectively stripped only a series of sacrificial gate dielectric layers only in locations where new gate dielectric layers are desired to be formed, rather masking a only a portion of a partially sacrificial gate dielectric layer which is desired to be retained and stripping a sacrificial remainder of the gate dielectric layer. By employing the sequential selective stripping method, a semiconductor integrated circuit microelectronic fabrication is formed with enhanced reliability insofar as there is attenuated over etching into isolation regions which separate active regions of a semiconductor substrate.

14 Claims, 2 Drawing Sheets

METHOD FOR FORMING SEMICONDUCTOR INTEGRATED CIRCUIT MICROELECTRONIC FABRICATION HAVING MULTIPLE GATE DIELECTRIC LAYERS WITH MULTIPLE THICKNESSES

BACKGROUND OF THE INVENTION

1. Field of the Invention

The present invention relates generally to methods for forming gate dielectric layers within semiconductor integrated circuit microelectronic fabrications. More particularly, the present invention relates to methods for forming multiple gate dielectric layers with multiple thicknesses within semiconductor integrated circuit microelectronic fabrications.

2. Description of the Related Art

Semiconductor integrated circuit microelectronic fabrications are formed from semiconductor substrates over which are formed patterned conductor layers which are separated by dielectric layers.

As semiconductor integrated circuit microelectronic fabrication integration levels have increased and semiconductor integrated circuit microelectronic fabrication functionality levels have increased, it has become increasingly common in the art of semiconductor integrated circuit microelectronic fabrication to form within semiconductor integrated circuit microelectronic fabrications pluralities of semiconductor devices which are formed with corresponding pluralities of gate dielectric layers having corresponding pluralities of gate dielectric layer thicknesses. Within the context of the present invention, gate dielectric layers are intended as dielectric layers which are formed directly upon silicon semiconductor substrates, whether or not they are employed within field effect transistor (FET) devices, although gate dielectric layers are most typically employed within field effect transistor (FET) devices within semiconductor integrated circuit microelectronic fabrications. Similarly, although gate dielectric layers within semiconductor integrated circuit microelectronic fabrications are most commonly formed employing thermal oxidation methods, gate dielectric layers within semiconductor integrated circuit microelectronic fabrications may also be formed employing various combinations of thermal oxidation methods, deposition methods and nitridation methods.

It has become increasingly common in the art of semiconductor integrated circuit microelectronic fabrication to form within semiconductor integrated circuit microelectronic fabrications pluralities of semiconductor devices which are formed with corresponding pluralities of gate dielectric layers having corresponding pluralities of gate dielectric layer thicknesses insofar as the functional requirements and operational requirements of the pluralities of semiconductor devices formed within the semiconductor integrated circuit microelectronic fabrications often demand the plurality of gate dielectric layers having the plurality of gate dielectric layer thicknesses. For example and without limitation, within embedded semiconductor integrated circuit microelectronic fabrications (i.e., semiconductor integrated circuit microelectronic fabrications which perform both a logic function and a memory function), it is common to employ comparatively thin gate dielectric layers within field effect transistor (FET) devices which perform the logic function, such as to enhance operating speed of the field effect transistor (FET) devices which perform the logic function, while employing comparatively thick gate dielectric layers within field effect transistor (FET) devices which perform memory functions or other peripheral functions, wherein the field effect transistor (FET) devices which perform the memory function or other peripheral function are subject to comparatively high operating voltages.

While it is thus desirable in the art of semiconductor integrated circuit microelectronic fabrication to provide pluralities of semiconductor devices having corresponding pluralities of gate dielectric layers in turn having corresponding pluralities of gate dielectric layers thicknesses, and often unavoidable in the art of semiconductor integrated circuit microelectronic fabrication to provide pluralities of semiconductor devices having corresponding pluralities of gate dielectric layers in turn having corresponding pluralities of gate dielectric layer thicknesses, forming within semiconductor integrated circuit microelectronic fabrications such semiconductor devices having corresponding pluralities of gate dielectric layers in turn having corresponding pluralities of gate dielectric layer thicknesses is not entirely without problems in the art of semiconductor integrated circuit microelectronic fabrication.

In that regard, it is often difficult to form within semiconductor integrated circuit microelectronic fabrications pluralities of semiconductor devices having corresponding pluralities of gate dielectric layers in turn having corresponding pluralities of gate dielectric layer thicknesses with enhanced reliability of the semiconductor integrated circuit microelectronic fabrications.

It is thus desirable in the art of semiconductor integrated circuit microelectronic fabrication to form within semiconductor integrated circuit microelectronic fabrications pluralities of semiconductor devices having corresponding pluralities of gate dielectric layers in turn having corresponding pluralities of gate dielectric layers thicknesses, with enhanced reliability of the semiconductor integrated circuit microelectronic fabrications.

It is towards the foregoing object that the present invention is directed.

Various methods have been disclosed in the art of semiconductor integrated circuit microelectronic fabrication for forming, with corresponding pluralities of gate dielectric layers having corresponding pluralities of gate dielectric layer thicknesses, pluralities of semiconductor devices within semiconductor integrated circuit microelectronic fabrications.

Included among the methods, but not limiting among the methods, are methods disclosed within: (1) Barsan et al., in U.S. Pat. No. 5,672,521 (a method which employs implanting into a first region of a silicon semiconductor substrate a dose of a dopant which enhances thermal oxidation of the silicon semiconductor substrate and implanting into a second region of the silicon semiconductor substrate a dose of a nitrogen dopant which inhibits thermal oxidation of the silicon semiconductor substrate, such that upon thermal oxidation of the silicon semiconductor substrate including the first region, the second region and an unimplanted third region there is formed upon the silicon semiconductor substrate a gate dielectric layer having three thickness regions); (2) Chwa et al., in U.S. Pat. No. 6,147,008 (a method which employs implanting through a gate dielectric layer formed upon a silicon semiconductor substrate a dose of a nitrogen implanting ion which inhibits thermal oxidation of the silicon semiconductor and then patterning the gate dielectric layer to form a patterned gate dielectric layer which leaves exposed implanted and unimplanted portions of the silicon semiconductor substrate, prior to thermally oxidizing the silicon semiconductor substrate to reform a gate dielectric layer having three thickness regions); and (3) Sung, in U.S. Pat. No. 6,184,093 (a method for forming differential gate oxide layer thicknesses within field effect transistor (FET) devices within semiconductor integrated circuit microelectronic fabrications by forming a first gate dielectric layer having a first thickness in both a central memory region and a peripheral region of a silicon semiconductor substrate and forming a pair of gate electrodes thereupon, followed by forming a second gate dielectric layer with a second thickness within both the central memory region and the peripheral region of the silicon semiconductor substrate and forming a pair of gate electrodes thereupon).

Desirable in the art of semiconductor integrated circuit microelectronic fabrication are additional methods for forming within semiconductor integrated circuit microelectronic fabrications pluralities of semiconductor devices having corresponding pluralities of gate dielectric layers in turn having corresponding pluralities of gate dielectric layer thicknesses, with enhanced reliability of the semiconductor integrated circuit microelectronic fabrications.

It is towards the foregoing object that the present invention is directed.

SUMMARY OF THE INVENTION

A first object of the present invention is to provide a method for forming within a semiconductor integrated circuit microelectronic fabrication a plurality of semiconductor devices having a corresponding plurality of gate dielectric layers having a corresponding plurality of gate dielectric layer thicknesses.

A second object of the present invention is to provide a method in accord with the first object of the present invention, wherein the semiconductor integrated circuit microelectronic fabrication is formed with enhanced reliability.

A third object of the present invention is to provide a method in accord with the first object of the present invention and the second object of the present invention, wherein the method is readily commercially implemented.

In accord with the objects of the present invention, there is provided by the present invention a method for forming a plurality of gate dielectric layers within a microelectronic fabrication. To practice the method of the present invention, there is first provided a semiconductor substrate having formed therein at least a pair of isolation regions which defines a series of at least three active regions of the semiconductor substrate. There is then formed, while employing a first thermal oxidation method, a series of at least three first gate dielectric layers formed to a first thickness upon the series of at least three active regions of the semiconductor substrate. There is then masked the semiconductor substrate to leave uncovered only a second of the at least three first gate dielectric layers and stripped from only a second of the at least three active regions of the semiconductor substrate only the second of the at least three first gate dielectric layers. There is then formed, while employing a second thermal oxidation method, a second gate dielectric layer upon only the second of the at least three active regions of the semiconductor substrate. There is then masked the semiconductor substrate to leave uncovered only a third of the at least three first gate dielectric layers and stripped from only a third of the at least three active regions of the semiconductor substrate only the third of the at least three first gate dielectric layers. Finally, there is then formed, while employing a third thermal oxidation method, a third gate dielectric layer having a third thickness upon only the third of the at least three active regions of the semiconductor substrate.

Within the present invention, by selectively stripping from only the second of the at least three active regions of the semiconductor substrate only the second of the at least three gate dielectric layers and selectively stripping from only the third of the at least three active regions of the semiconductor substrate only the third of the at least three gate dielectric layers, a remaining first gate dielectric layer, the second gate dielectric layer and the third gate dielectric layer are formed with attenuated etching of the pair of isolation regions.

There is provided by the present invention a method for forming within a semiconductor integrated circuit microelectronic fabrication a plurality of semiconductor devices having a corresponding plurality of gate dielectric layers having a corresponding plurality of gate dielectric layer thicknesses, wherein the semiconductor integrated circuit microelectronic fabrication is formed with enhanced reliability.

The present invention realizes the foregoing object incident to having formed a series of at least three first gate dielectric layers upon a series of at least three active regions of a semiconductor substrate separated by at least a pair of isolation regions within the semiconductor substrate by: (1) selectively stripping from only a second of the at least three active regions of the semiconductor substrate only a second of the at least three gate dielectric layers prior to forming a second gate dielectric layer upon the second of the at least three active regions of the semiconductor substrate; and (2) selectively stripping from only a third of the at least three active regions of the semiconductor substrate only a third of the at least three gate dielectric layers prior to forming a third gate dielectric layer upon the third of the at least three active regions of the semiconductor substrate. By employing such a selective sequential stripping method, a remaining first gate dielectric layer, the second gate dielectric layer and the third gate dielectric layer are formed with attenuated etching of the pair of isolation regions, and the semiconductor integrated circuit microelectronic fabrication is thus formed with enhanced reliability.

The method of the present invention is readily commercially implemented.

The present invention employs methods and materials as are otherwise generally conventional in the art of semiconductor integrated circuit microelectronic fabrication, but employed within the context of a specific process ordering and specific materials limitations to provide the present invention. Since it is thus at least in part a specific process ordering and specific materials limitations which provide the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
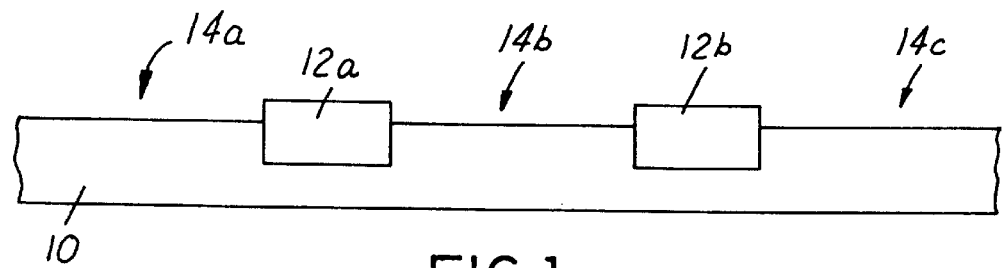
FIG. 1, FIG. 2, FIG. 3, FIG. 4, FIG. 5, FIG. 6 and FIG. 7 show a series of schematic cross-sectional diagrams illustrating the results of progressive stages in forming within a semiconductor integrated circuit microelectronic fabrication, and in accord with a preferred embodiment of the present invention, a series of field effect transistor (FET) devices.

The present invention provides a method for forming within a semiconductor integrated circuit microelectronic fabrication a plurality of semiconductor devices having a corresponding plurality of gate dielectric layers having a corresponding plurality of gate dielectric layer thicknesses, wherein the semiconductor integrated circuit microelectronic fabrication is formed with enhanced reliability.

The present invention realizes the foregoing object incident to having formed a series of at least three first gate dielectric layers upon a series of at least three active regions of a semiconductor substrate separated by at least a pair of isolation regions within the semiconductor substrate by: (1) selectively stripping from only a second of the at least three active regions of the semiconductor substrate only a second of the at least three gate dielectric layers incident prior to forming a second gate dielectric layer upon the second of the at least three active regions of the semiconductor substrate; and (2) selectively stripping from only a third of the at least three active regions of the semiconductor substrate only a third of the at least three gate dielectric layers prior to forming a third gate dielectric layer upon the third of the at least three active regions of the semiconductor substrate. By employing such a selective sequential stripping method, a remaining first gate dielectric layer, the second gate dielectric layer and the third gate dielectric layer are formed with attenuated etching of the pair of isolation regions, and the semiconductor integrated circuit microelectronic fabrication is thus formed with enhanced reliability.

As is understood by a person skilled in the art, and in contrast within the disclosures cited within the Description of the Related Art, the teachings of all of which related art is incorporated herein fully by reference, the present invention typically and preferably does not employ an ion implantation method for purposes of enhancing or retarding susceptibility of a semiconductor substrate to oxidation when forming upon the semiconductor substrate a plurality of gate oxide layers having a plurality of thicknesses.

Although the preferred embodiment of the present invention illustrates the present within the context of forming within a semiconductor integrated circuit microelectronic fabrication three gate dielectric layers formed upon three active regions of a semiconductor substrate in turn separated by a pair of isolation regions formed within the semiconductor substrate, the present invention is extendable to increased numbers of gate dielectric layers formed upon increased numbers of active regions of a semiconductor substrate separated by increased numbers of isolation regions formed within the semiconductor substrate.

Similarly, although the preferred embodiment of the present invention illustrates the present within the context of forming within a semiconductor integrated circuit microelectronic fabrication three gate dielectric layers formed upon three active regions of a semiconductor substrate in turn separated by a pair of isolation regions formed within the semiconductor substrate, the present invention is also intended to be applicable to increased numbers of active regions of a semiconductor substrate upon which is it desired to form a corresponding number of gate dielectric layers, each with an equivalent thickness in comparison with separate additional numbers of active regions of the semiconductor substrate upon which it is desired to form a corresponding number of gate dielectric layers with a different thickness.

Referring now to FIG. 1 to FIG. 7, there is shown a series of schematic cross-sectional diagrams illustrating the results of progressive stages in forming within a semiconductor integrated microelectronic fabrication, and in accord with a preferred embodiment of the present invention, a series of field effect transistor (FET) devices.

Shown in FIG. 1 is a schematic cross-sectional diagram of the semiconductor integrated circuit microelectronic fabrication at an early stage in its fabrication in accord with the preferred embodiment of the present invention.

Shown in FIG. 1 is a semiconductor substrate 10 having formed therein at least a pair of isolation regions 12a and 12b which define a series of at least three active regions 14a, 14b and 14c of the semiconductor substrate 10.

Within the preferred embodiment of the present invention with respect to the semiconductor substrate 10, and although semiconductor substrates are known in the art of semiconductor integrated circuit microelectronic fabrication with either dopant polarity, several dopant concentrations and various crystallographic orientations, for the preferred embodiment of the present invention, the semiconductor substrate 10 is typically and preferably an N- or P- silicon semiconductor substrate.

Within the preferred embodiment of the present invention with respect to the pair of isolation regions 12a and 12b, and although it is also known in the art of semiconductor integrated circuit microelectronic fabrication that isolation regions may be formed employing methods including but not limited to isolation region thermal growth methods and isolation region deposition/patterning methods, either of which are applicable within the context of the present invention, for the preferred embodiment of the present invention, the pair of isolation regions 12a and 12b is, as is illustrated within the schematic cross-sectional diagram of FIG. 1, typically and preferably formed as a pair of shallow trench isolation (STI) regions which rise slightly above the plane of the active regions 14a, 14b and 14c of the semiconductor substrate 10. Within the preferred embodiment of the present invention, typically and preferably, each of the pair of isolation regions 12a and 12b is formed of a linewidth of from about 0.1 to about 5 microns, while each of the active regions 14a, 14b and 14c of the semiconductor substrate 10 is formed of a linewidth of from about 0.1 to about 5 microns.

Figure 2:
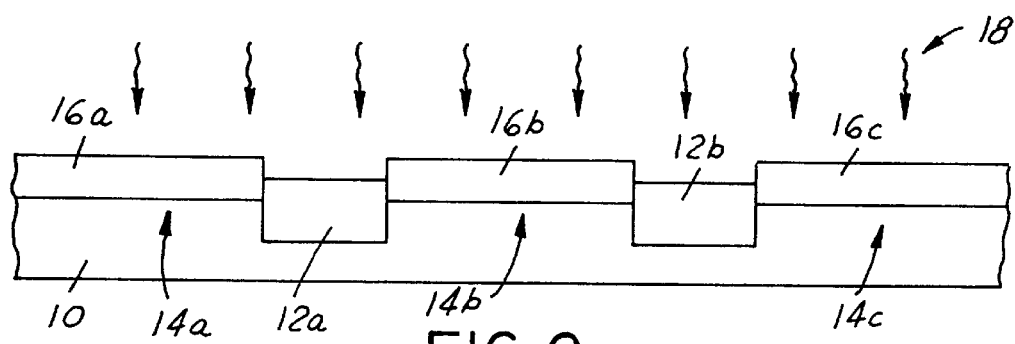

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein the semiconductor substrate 10 has been thermally annealed within a first thermal oxidizing atmosphere 18 to form upon each of the series of at least three active regions 14a, 14b and 14c of the semiconductor substrate 10 a corresponding series of at least three first gate dielectric layers 16a, 16b and 16c.

Within the preferred embodiment of the present invention, the semiconductor substrate 10 as is illustrated within the schematic cross-sectional diagram of FIG. 1 is thermally annealed within the first thermal oxidizing atmosphere 18 at a temperature of from about 750 to about 1000 degrees centigrade for a time period of from about 5 to about 120 minutes to form each of the series of at least three first gate dielectric layers 16a, 16b and 16c of silicon oxide formed to a thickness of from about 30 to about 100 angstroms upon each of the active regions 14a, 14b and 14c of the semiconductor substrate 10, as illustrated within the schematic cross-sectional diagram of FIG. 2.

Figure 3:
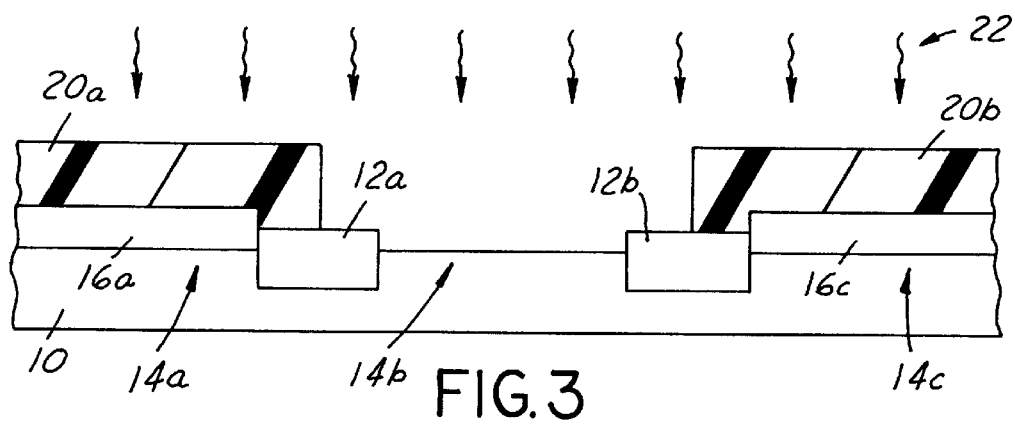

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein, in a first instance, there is formed covering completely a first of the at least three gate dielectric layers 16a and a third of the at least three gate dielectric layers 16c a corresponding pair of patterned first photoresist layers 20a and 20b which leaves exposed only a location wherein there was formed upon the remaining of the at least three active regions 14b of the semiconductor substrate 10 the first gate dielectric layer 16b.

Within the present invention and the preferred embodiment of the present invention with respect to the pair of patterned first photoresist layers 20a and 20b, the pair of patterned first photoresist layers 20a and 20b may be formed of photoresist materials as are conventional or unconventional in the art of semiconductor integrated circuit microelectronic fabrication, including but not limited to photoresist materials selected from the general groups of photoresist materials including but not limited to positive photoresist materials and negative photoresist materials. Typically and preferably, each of the pair of patterned photoresist layers 20a and 20b is formed to a thickness of from about 1000 to about 5000 angstroms.

Also show within the context of its absence within the schematic cross-sectional diagram of FIG. 3 is the first gate dielectric layer 16b which has been selectively stripped (in comparison with the first gate dielectric layers 16a and 16c) from the active region 14b of the semiconductor substrate 10 through action of a first etchant 22, while employing the pair of patterned first photoresist layers 20a and 20b as first etch mask layer.

Within the preferred embodiment of the present invention, the first etchant 22 may comprise an etchant as is conventional or unconventional in the art of semiconductor integrated circuit microelectronic fabrication, including but not limited to wet chemical etchants and dry plasma etchants, which preferably show particular specificity for the dielectric material from which is formed the first gate dielectric layer 16b with respect to the dielectric material from which is formed the isolation regions 12a and 12b. Within the present invention and the preferred embodiment of the present invention, it has been determined experimentally that a vaporous hydrofluoric acid etchant is a particularly efficient etchant for selectively stripping from the semiconductor integrated circuit microelectronic fabrication whose schematic cross-sectional diagram is illustrated in FIG. 2 the first gate dielectric layer 16b (when formed of a thermally grown silicon oxide material) to provide in part the semiconductor integrated circuit microelectronic fabrication whose schematic cross-sectional diagram is illustrated in FIG. 3.

Figure 4:
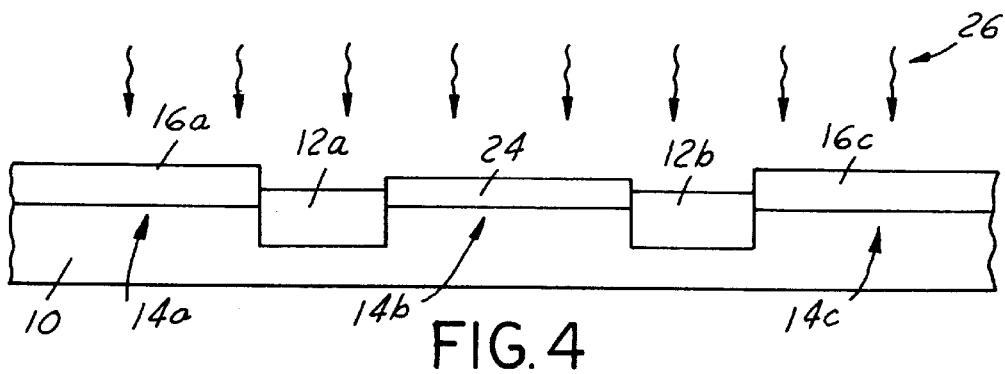

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein, in a first instance, the pair of patterned first photoresist layers 20a and 20b has been stripped from the semiconductor integrated circuit microelectronic fabrication.

Within the present invention and the preferred embodiment of the present invention, the pair of patterned first photoresist layers 20a and 20b may be stripped from the semiconductor integrated circuit microelectronic fabrication whose schematic cross-sectional diagram is illustrated in FIG. 3 to provide in part the semiconductor integrated circuit microelectronic fabrication whose schematic cross-sectional diagram is illustrated in FIG. 4 while employing photoresist stripping methods and materials as are conventional or unconventional in the art of semiconductor integrated circuit microelectronic fabrication.

Finally, there is also shown within the schematic cross-sectional diagram of FIG. 4 formed upon the active region 14b of the semiconductor substrate 10 a second gate dielectric layer 24 formed employing a second thermal annealing of the semiconductor substrate 10 within a second thermal oxidizing atmosphere 26.

Within the present invention and the preferred embodiment of the present invention, the second thermal oxidizing atmosphere 26 is typically and preferably provided at a temperature of from about 750 to about 900 degrees centigrade for a time period of from about 5 to about 60 minutes to form the second gate dielectric layer 24 of thickness from about 15 to about 50 angstroms formed upon the active region 14b of the semiconductor substrate 10. Under such conditions, and due to a decreased thickness of the second gate dielectric layer 24 in comparison with the pair of first gate dielectric layers 16a and 16c, the pair of first gate dielectric layers 16a and 16c do not appreciably increase in thickness when forming the second gate dielectric layer 24.

Figure 5:
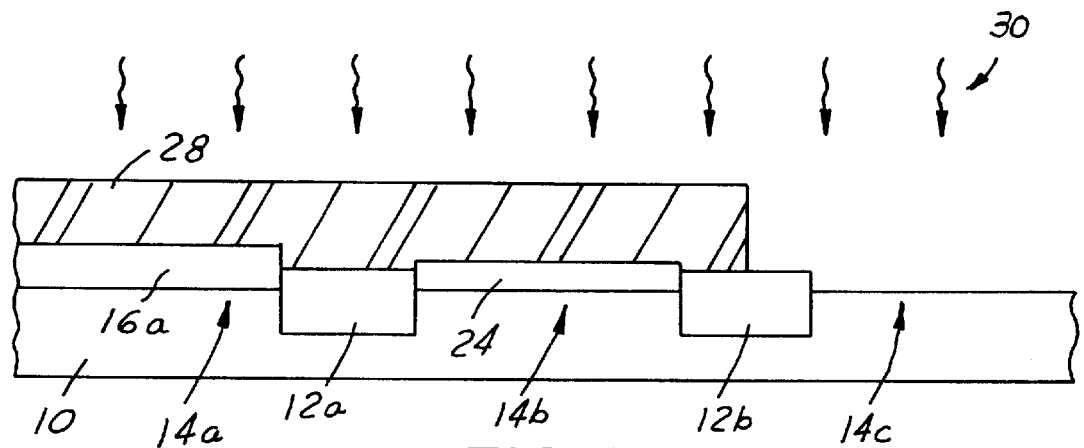

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein there is formed spanning the first gate dielectric layer 16a and the second gate dielectric layer 24 a patterned second photoresist layer 28 which leaves exposed only a region of the semiconductor integrated circuit microelectronic fabrication wherein there was formed the first gate dielectric layer 16c.

Within the present invention and the preferred embodiment of the present invention, the patterned second photoresist layer 28 as illustrated within the schematic cross-sectional diagram of FIG. 5 may be formed employing methods, materials and dimensions analogous or equivalent to the methods, materials and dimensions employed for forming the pair of patterned first photoresist layers 20a and 20b as illustrated within the schematic cross-sectional diagram of FIG. 3.

Shown also within the schematic cross-sectional diagram of FIG. 5, by its absence, is a third of the three patterned first gate dielectric layers 16c which has been selectively stripped from the semiconductor integrated circuit microelectronic fabrication whose schematic cross-sectional diagram is illustrated in FIG. 5 through use of a second etchant 30.

Within the present invention and the preferred embodiment of the present invention, the second etchant 30 may be provided employing methods and materials analogous or equivalent to the methods and materials employed for providing the first etchant 22 as illustrated within the schematic cross-sectional diagram of FIG. 3. Similarly, and in accord with the above, a vaporous hydrofluoric acid etching is preferred for stripping from the semiconductor integrated circuit microelectronic fabrication whose schematic cross-sectional diagram is illustrated in FIG. 4 the first gate dielectric layer 16c to provide in part the semiconductor integrated circuit microelectronic fabrication whose schematic cross-sectional diagram is illustrated in FIG. 5 such a vaporous hydrofluoric acid etchant exhibits a desirable specificity for the dielectric material from which is formed the first gate dielectric layer 16c in comparison with the dielectric material from which is formed the isolation region 12b.

Figure 6:
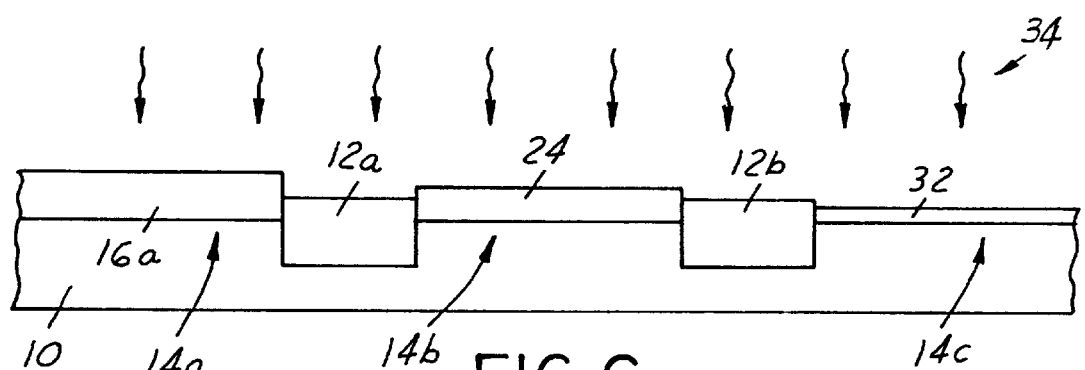

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein there is formed upon the third active region 14c of the semiconductor substrate 10 a third gate dielectric layer 32 through thermal oxidation of the semiconductor integrated circuit microelectronic fabrication within a third thermal oxidizing atmosphere 34.

Within the present invention and the preferred embodiment of the present invention, the third thermal oxidizing atmosphere 34 is provided at a temperature of from about 600 to about 900 degrees centigrade and a time period of from about 5 to about 60 minuted to provide the patterned third dielectric layer 32 of thickness from about 15 to about 50 angstroms formed upon the third active region 14c of the semiconductor substrate 10.

Similarly, while the remaining first gate dielectric layer 16a is not in general subject to an increase in thickness incident to exposure to the third thermal oxidizing atmosphere 34, there may be observed within the context of the present invention and the preferred embodiment of the present invention an increase in thickness of the second gate dielectric layer 24 from its original thickness of from about 15 to about 50 angstroms to a final thickness of from about 15 to about 50 angstroms.

Figure 7:
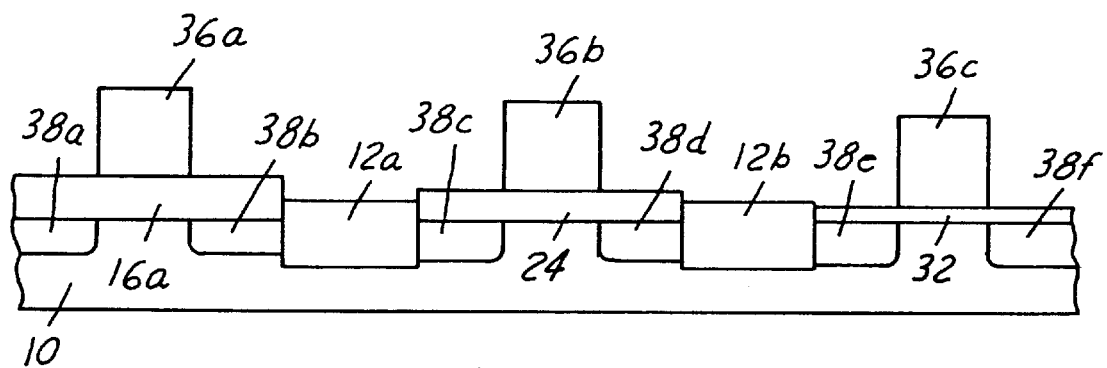

Referring now to FIG. 7, there is shown a schematic cross-sectional diagram illustrating the results of further processing of the semiconductor integrated circuit microelectronic fabrication whose schematic cross-sectional diagram is illustrated in FIG. 6.

Shown in FIG. 7 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 6, but wherein there is formed upon each of the corresponding remaining first gate dielectric layer 16a, second gate dielectric layer 24 and third gate dielectric layer 32 a corresponding gate electrode 36a, 36b or 36c. There is also shown within the schematic cross-sectional diagram of FIG. 7 formed into various locations within the active regions 14a, 14b and 14c of the semiconductor substrate 10 while employing the series of gate electrodes 36a, 36b and 36 as a series of masks a series of source/drain regions 38a, 38b, 38c, 38d, 38e and 38f which in conjunction with the series of gate dielectric layers 16a, 24 and 32 and the series of gate electrodes 36a, 36b and 36c form a series of field effect transistor (FET) devices.

Within the present invention and the preferred embodiment of the present invention, the series gate electrodes 36a, 36b and 36c may be formed of gate electrode materials as are conventional or unconventional in the art of semiconductor integrated circuit microelectronic fabrication, but will typically and preferably comprise at least in part polysilicon gate electrode materials. Similarly, within the present invention and the preferred embodiment of the present invention with respect to the series of source/drain regions 38a, 38b, 38c, 38d, 38e and 38f, the series of source/drain regions 38a, 38b, 38c, 38d, 38e and 38f is typically and preferably formed employing an ion implantation method as is otherwise generally conventional in the art of semiconductor integrated circuit microelectronic fabrication, and provided at an ion implantation dose of from about $1E14/cm^2$ to about $1E16/cm^2$ ions per square centimeter and an ion implantation energy of from about 1 to about 500 kev.

Upon forming the semiconductor integrated circuit microelectronic fabrication whose schematic cross-sectional diagram is illustrated in FIG. 7, there is formed a semiconductor integrated circuit microelectronic fabrication in accord with the preferred embodiment of the present invention. The semiconductor integrated circuit microelectronic fabrication so formed is formed with enhanced reliability insofar as when forming within the semiconductor integrated circuit microelectronic fabrication three gate dielectric layers having three different thicknesses, there is appropriately masked and stripped from a semiconductor substrate only a sacrificial gate dielectric layer where there is desired to form a new gate dielectric layer, rather in comparison than appropriately masking only a gate dielectric layer which is desired to be retained and stripping all remaining portions of the gate dielectric layer. Under such circumstances, there is avoided over etching into an isolation region which separates a pair of active regions of the semiconductor substrate, thus providing the semiconductor integrated circuit microelectronic fabrication with enhanced reliability.

As is understood by a person skilled in the art, the preferred embodiment of the present invention is illustrative of the present invention rather than limiting of the present invention. Revisions and modifications may be undertaken with respect to a semiconductor integrated circuit microelectronic fabrication in accord with the preferred embodiment of the present invention, while still fabricating a semiconductor integrated circuit microelectronic fabrication in accord with the present invention, further in accord with the accompanying claims.

What is claimed is:

1. A method for forming a plurality of gate dielectric layers comprising:

providing a semiconductor substrate having formed therein at least a pair of isolation regions which defines a series of at least three active regions of the semiconductor substrate;

forming, while employing a first thermal oxidation method, a series of at least three first gate dielectric layers formed to a first thickness upon the series of at least three active regions of the semiconductor substrate;

masking the semiconductor substrate to leave uncovered only a second of the at least three first gate dielectric layers and stripping from only a second of the at least three active regions of the semiconductor substrate only the second of the at least three first gate dielectric layers;

forming, while employing a second thermal oxidation method, a second gate dielectric layer upon only the second of the at least three active regions of the semiconductor substrate;

masking the semiconductor substrate to leave uncovered only a third of the at least three first gate dielectric layers and stripping from only a third of the at least three active regions of the semiconductor substrate only the third of the at least three first gate dielectric layers; and forming, while employing a third thermal oxidation method, a third gate dielectric layer having a third thickness upon only the third of the at least three active regions of the semiconductor substrate.

2. The method of claim 1 wherein the first thickness is greater than the second thickness which in turn is greater than the third thickness.

3. The method of claim 1 wherein by stripping from only the second of the at least three active regions of the semiconductor substrate only the second of the at least three gate dielectric layers and stripping from only the third of the at least three active regions of the semiconductor substrate only the third of the at least three gate dielectric layers, a remaining first gate dielectric layer, the second gate dielectric layer and the third gate dielectric layer are formed with attenuated etching of the pair of isolation regions.

4. The method of claim 1 wherein the series of at least three first gate dielectric layers is formed to a thickness of from about 30 to about 150 angstroms and the first thermal oxidation method employs a temperature of from about 750 to about 1000 degrees centigrade for a timer period of from about 5 to about 120 minutes.

5. The method of claim 1 wherein the second gate dielectric layer is formed to a thickness of from about 15 to about 50 angstroms and the second thermal oxidation method employs a temperature of from about 600 to about 900 degrees centigrade for a timer period of from about 5 to about 60 minutes.

6. The method of claim 1 wherein the third gate dielectric layer is formed to a thickness of from about 15 to about 30 angstroms and the third thermal oxidation method employs a temperature of from about 600 to about 900 degrees centigrade for a timer period of from about 5 to about 60 minutes.

7. The method of claim 1 wherein there is not implanted the semiconductor substrate for purposes of enhancing or retarding formation of a gate dielectric layer.

8. A method for forming a semiconductor integrated circuit microelectronic fabrication comprising:

providing a semiconductor substrate having formed therein at least a pair of isolation regions which defines a series of at least three active regions of the semiconductor substrate;

forming, while employing a first thermal oxidation method, a series of at least three first gate dielectric layers formed to a first thickness upon the series of at least three active regions of the semiconductor substrate;

masking the semiconductor substrate to leave uncovered only a second of the at least three first gate dielectric layers and stripping from only a second of the at least three active regions of the semiconductor substrate only the second of the at least three first gate dielectric layers;

forming, while employing a second thermal oxidation method, a second gate dielectric layer upon only the second of the at least three active regions of the semiconductor substrate;

masking the semiconductor substrate to leave uncovered only a third of the at least three first gate dielectric layers and stripping from only a third of the at least three active regions of the semiconductor substrate only the third of the at least three first gate dielectric layers;

forming, while employing a third thermal oxidation method, a third gate dielectric layer having a third thickness upon only the third of the at least three active regions of the semiconductor substrate; and forming while employing the remaining first gate dielectric layer, the second gate dielectric layer and the third gate dielectric layer, a series of field effect transistor (FET) devices within the semiconductor substrate.

9. The method of claim 8 wherein the first thickness is greater than the second thickness which in turn is greater than the third thickness.

10. The method of claim 8 wherein by stripping from only the second of the at least three active regions of the semiconductor substrate only the second of the at least three gate dielectric layers and stripping from only the third of the at least three active regions of the semiconductor substrate only the third of the at least three gate dielectric layers, a remaining first gate dielectric layer, the second gate dielectric layer and the third gate dielectric layer are formed with attenuated etching of the pair of isolation regions.

11. The method of claim 8 wherein the series of at least three first gate dielectric layers is formed to a thickness of from about 30 to about 100 angstroms and the first thermal oxidation method employs a temperature of from about 750 to about 1000 degrees centigrade for a timer period of from about 5 to about 60 minutes.

12. The method of claim 8 wherein the second gate dielectric layer is formed to a thickness of from about 15 to about 50 angstroms and the second thermal oxidation method employs a temperature of from about 600 to about 900 degrees centigrade for a timer period of from about 5 to about 60 minutes.

13. The method of claim 8 wherein the third gate dielectric layer is formed to a thickness of from about 15 to about 30 angstroms and the third thermal oxidation method employs a temperature of from about 600 to about 900 degrees centigrade for a timer period of from about 5 to about 60 minutes.

14. The method of claim 8 wherein there is not implanted the semiconductor substrate for purposes of enhancing or retarding formation of a gate dielectric layer.

* * * * *